United States Patent [19]

Murari et al.

[11] Patent Number: 5,696,404
[45] Date of Patent: Dec. 9, 1997

[54] SEMICONDUCTOR WAFERS WITH DEVICE PROTECTION MEANS AND WITH INTERCONNECT LINES ON SCRIBING LINES

[75] Inventors: Bruno Murari; Roberto Toscani; Fabio Marchio; Sandro Storti, all of Milan, Italy

[73] Assignee: SGS-Thomson Microelectronics S.r.l., Agrate Brianza, Italy

[21] Appl. No.: 527,763

[22] Filed: Sep. 13, 1995

[30] Foreign Application Priority Data

Sep. 13, 1994 [EP] European Pat. Off. .............. 94830425

[51] Int. Cl.⁶ .............................. H01L 23/62; H01L 29/00
[52] U.S. Cl. .................. 257/620; 257/355; 257/358; 257/503; 257/546
[58] Field of Search ....................... 257/355, 358, 257/503, 508, 546, 620, 690, 691

[56] References Cited

U.S. PATENT DOCUMENTS

| | | | |
|---|---|---|---|
| 5,349,219 | 9/1994 | Marao et al. | 257/210 |
| 5,459,688 | 10/1995 | Pfiester et al. | 257/393 |
| 5,466,952 | 11/1995 | Moody | 257/355 |
| 5,539,325 | 7/1996 | Rostoker et al. | 437/8 |
| 5,548,135 | 8/1996 | Avery | 257/173 |

FOREIGN PATENT DOCUMENTS

| | | | |
|---|---|---|---|
| 02 186 673 | 7/1990 | Japan | H01L 27/04 |
| 05 041 429 | 2/1993 | Japan | H01L 21/66 |

OTHER PUBLICATIONS

"Wafer level test and burn-in," *IBM Technical Disclosure Bulletin*, 33:8, Jan., 1991, pp. 1-2.

"Wafer burn-in isolation circuit," *IBM Technical Disclosure Bulletin*, 32:68, Nov., 1989, pp. 442-443.

R. Bove et al., "Impedance terminator for AC testing monolithic chips," *IBM Technical Disclosure Bulletin*, 15:9, Feb., 1973, pp. 2681-2682.

*Primary Examiner*—Tom Thomas
*Assistant Examiner*—Fetsum Abraham
*Attorney, Agent, or Firm*—David V. Carlson; Seed and Berry LLP

[57] ABSTRACT

A manufacturing method for fabricating integrated electronic circuits on a semiconductor support provides a plurality of integrated circuits and provides a plurality of scribing lines. The scribing lines are located such that the electronic circuits are regularly spaced apart by the scribing lines. A network of electrical connection lines is provided in at least one of the scribing lines. Metallization strips are provided in the scribing lines as electrical connection lines, and the electrical connection lines are connected to the integrated circuit. At least one current limitation element is provided between the electrical connection line and the integrated circuit. In this manner it is possible to simultaneously perform electrical testing of all the circuits present on the same wafer.

30 Claims, 5 Drawing Sheets

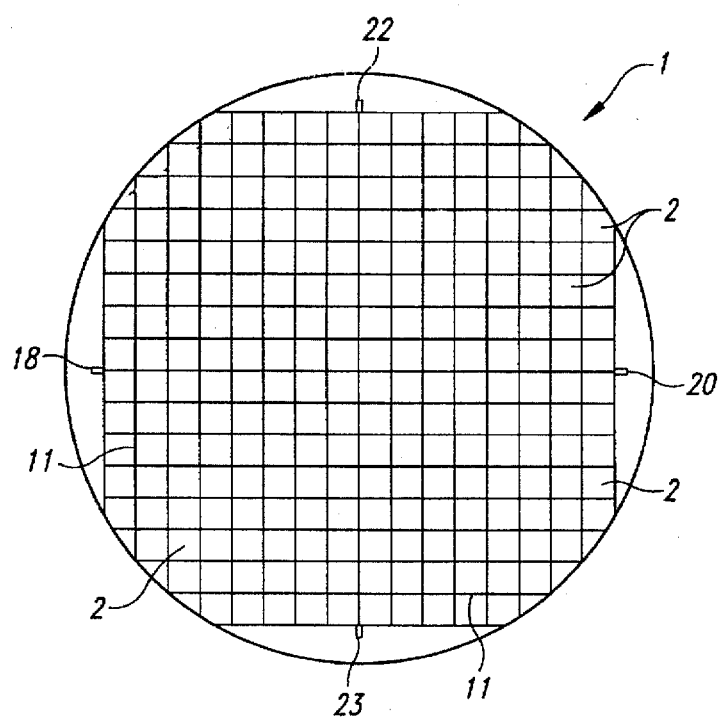
Fig. 1
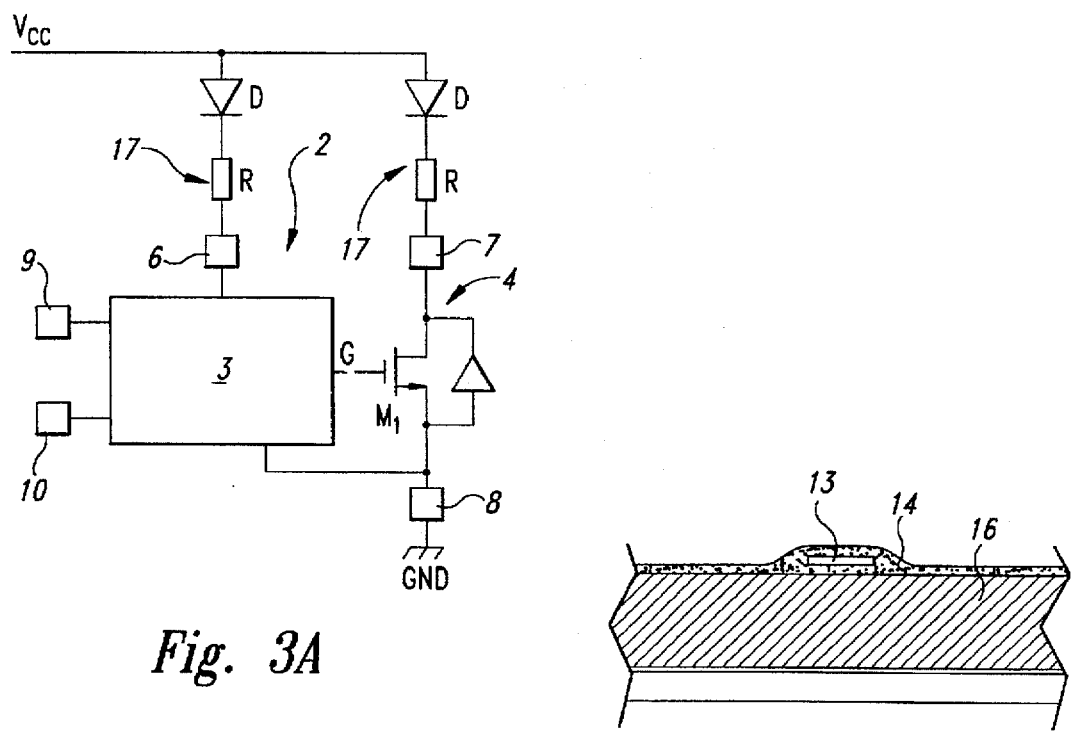
Fig. 3A
Fig. 5

SEMICONDUCTOR WAFERS WITH DEVICE PROTECTION MEANS AND WITH INTERCONNECT LINES ON SCRIBING LINES

TECHNICAL FIELD

The present invention relates to a manufacturing method for electronic circuits, and more particularly to a manufacturing method for electronic circuits monolithically integrated on a semiconductor support on which the electronic circuits are regularly arranged side by side and separated by dividing grooves, and to a semiconductor wafer incorporating a plurality of the electronic circuits.

BACKGROUND OF THE INVENTION

As is known, the production process leading to the provision on a large scale of integrated electronic circuits includes a number of processing steps which take place on a thin wafer of semiconductor material, e.g., a monocrystalline silicon wafer. The waver is subjected to a number of chemical and physical treatments and to photolithographic processes which lead to the definition of a complex three-dimensional topography constituting the integrated circuit architecture.

A single wafer can contain hundreds of identical integrated circuits commonly called chips and arranged regularly side by side and separated by scribing lines. In the annexed FIG. 1 is shown schematically a top view of a wafer incorporating a so-called chip matrix.

The processing of a wafer ends with electrical testing. Before the circuits are separated by sectioning the wafer, each circuit is tested to check if it operates correctly. Indeed, since it is impossible to avoid the presence of defects in the wafer, a certain percentage of circuits will exhibit defects or faults that may compromise their correct operation. Even a single defect can rain an entire circuit. A scratch of a few micrometers, or even a single grain of dust, can break a connection.

The most common failure state afflicting the semiconductor chips is the presence of short circuits inside the integrated structure.

The electrical testing is performed automatically by a test machine managed by a computer that rapidly checks one circuit after another and marks the defective ones to indicate that they are to be rejected. It is not possible to repair the defective circuits which are to be rejected. Otherwise, they would be uselessly subjected to subsequent costly operations of assembly and encapsulation in packages.

From this point of view it is necessary to take into consideration another important aspect of these problems. Some chips are subject to a phenomenon called "infant mortality" in which they pass the operation test but cease to operate shortly after being put into use. This type of failure, which takes place shortly after the first use of the circuits, is particularly harmful and a serious shortcoming for the manufacturer because the cost of additional inspection and encapsulation often exceeds the other production costs.

There is thus an unmet need in the art for a manufacturing method for integrated electronic circuits that allows easier, more economical, and rapid identification of defective circuits during the electrical inspection step and that overcomes the shortcomings which have limited the embodiments in accordance with the known art.

More specifically, there is also an unmet need in the art for a manufacturing method which allows identification and rejection of those circuits which would be subject to "infant mortality" and thus increases the quality of the entire final production.

SUMMARY OF THE INVENTION

The present invention provides a network of electrical connection lines used for diagnosis in the wafer of semiconductor material on which are provided the circuits. In this manner it is possible to simultaneously perform an electrical inspection of all the circuits present on the same wafer.

A manufacturing method for fabricating integrated electronic circuits on a semiconductor support provides a plurality of integrated circuits, and provides a plurality of scribing lines. The scribing lines are located such that the integrated circuits are regularly spaced apart by the scribing lines. A network of electrical connection lines is provided in at least one of the scribing lines. Metallization strips are provided in the scribing lines as electrical connection lines, and the electrical connection lines are connected to the integrated circuit. At least one current limitation element is provided between the electrical connection line and the integrated circuit.

The present invention also provides a wafer of semiconductor material having a plurality of integrated circuits. A plurality of scribing lines is positioned such that the integrated circuits are regularly spaced. A plurality of current limitation elements have at least a first current limitation element located in each of the integrated circuits. A plurality of electrical connection lines has at least a first electrical connection line located in at least one of the scribing lines. The first electrical connection line is coupled to the first current limitation element of at least one integrated circuit adjacent to the first electrical connection line, and the first electrical connection line is electrically connectable to a first voltage source.

The characteristics and advantages of the method in accordance with the present invention are set forth in the description of an embodiment thereof given below by way of non-limiting example with reference to a wafer of semiconductor material incorporating integrated electronic circuits and illustrated in the annexed drawings.

BRIEF DESCRIPTION OF THE DRAWINGS

FIG. 1 shows schematically a top view of a wafer or wafer of semiconductor material incorporating a plurality of integrated electronic circuits;

FIG. 3A shows a detail of an electrical diagram of one embodiment of the integrated electronic circuits of FIG. 2;

FIG. 5 shows in enlarged scale and vertical cross section of a partial detail of the wafer of FIG. 1 taken generally along plane of cut V—V of FIG. 2 but showing only a single metallization strip.

DETAILED DESCRIPTION OF THE INVENTION

FIG. 1 shows a thin wafer 1 of semiconductor material, e.g., a wafer of silicon on which have been provided multiple integrated circuits 2. The integrated circuits 2 are essentially square or rectangular in shape with a few millimeters per side and can be digital, analog, or power type. The integrated circuits 2 are separated from each other by a groove 11, i.e., a dividing line of approximately 200 μm termed a "scribing line" and present between one integrated circuit 2 and the next. The scribing line 11 completely surrounds each integrated circuit 2.

Figure 3B:
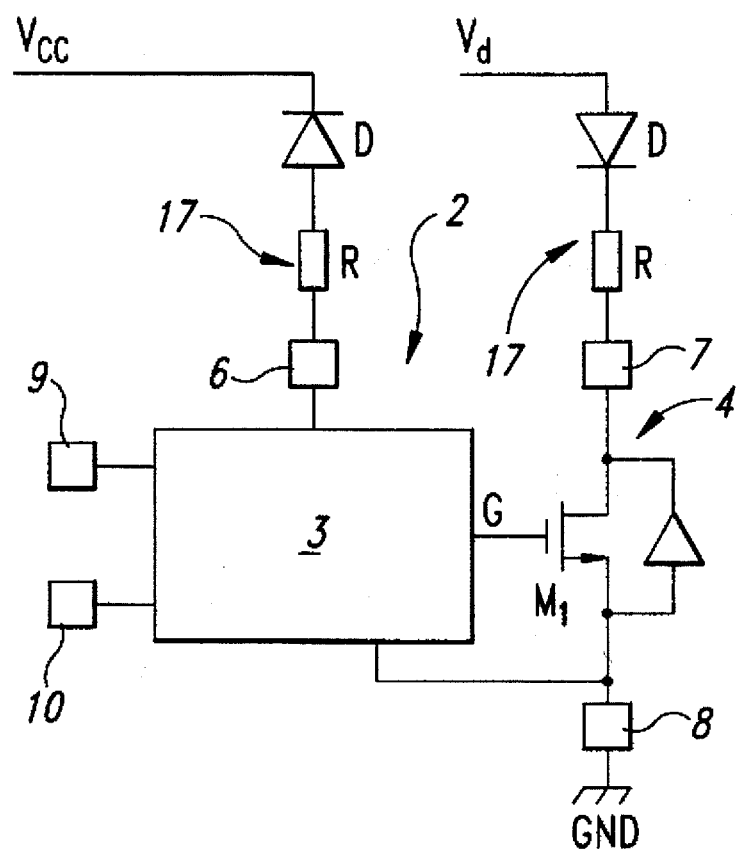
FIG. 3B shows a detail of an electronic diagram of another embodiment of the integrated electronic circuits of FIG. 2.

As shown in FIG. 3A, each integrated circuit 2 includes a first control circuit portion 3 designed to operate at supply voltage Vcc, typically +5 volts. A second power circuit portion 4 is in turn integrated in the circuit 2 in connection with the first control circuit portion 3. As shown in FIG. 3B, this second power circuit portion 4 is designed to operate at a supply voltage Vd, higher than supply voltage Vcc and typically +12 volts. However, as shown in FIG. 3A, power circuit portion 4 can also operate at supply voltage Vcc.

For the sake of simplicity of discussion the power circuit portion 4 has been diagrammed in FIGS. 3A and 3B with a single power transistor M1 having a control terminal G connected to an output of the first control circuit portion 3. Of course the power circuit portion 4 can be structured in a much more complex manner. The transistor M1 can be of the DMOS type and the integrated circuit 2 can be provided with BCD technology.

Figure 2:
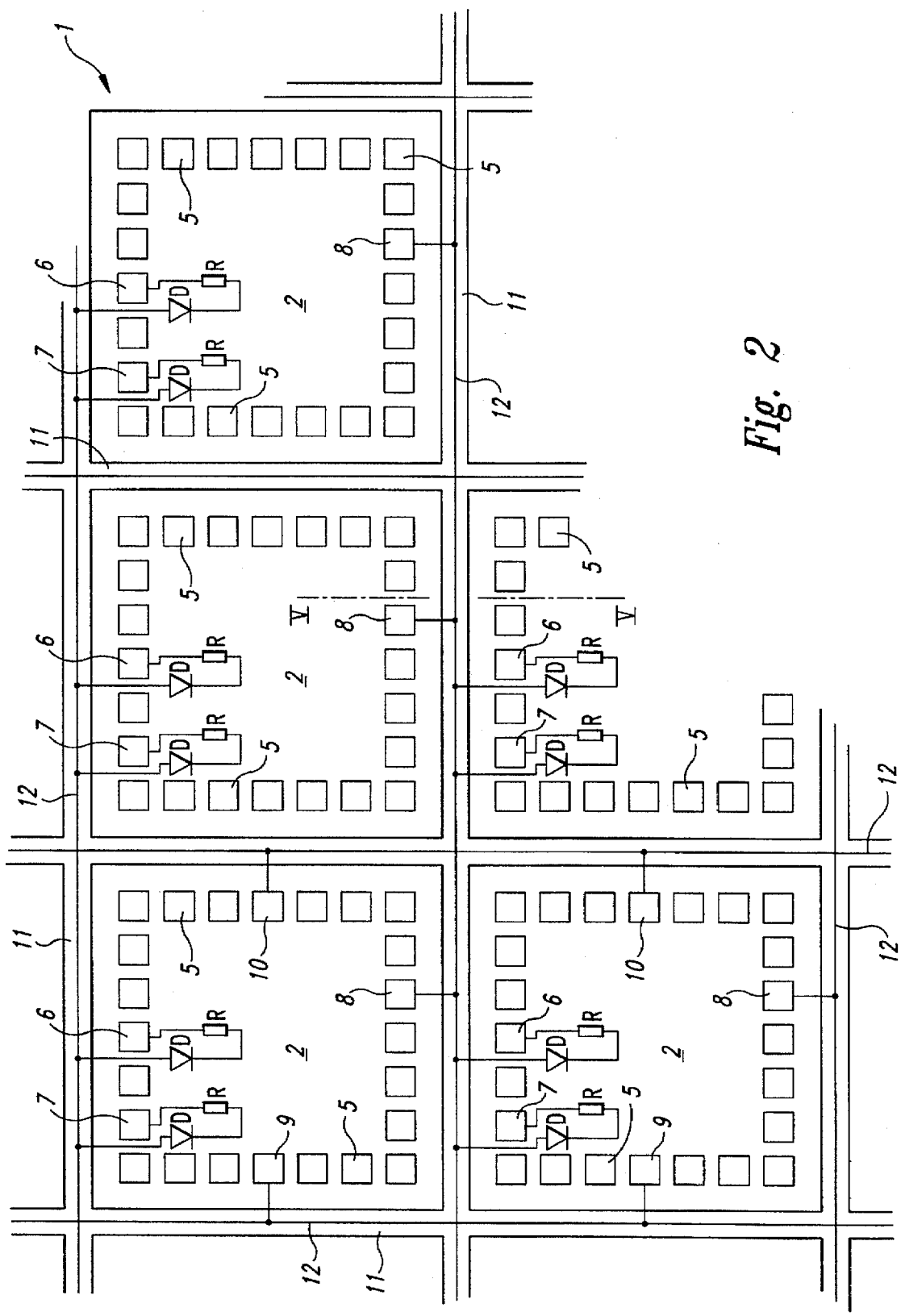
FIG. 2 shows schematically in enlarged scale a group of integrated electronic circuits provided in accordance with the method of the present invention on the wafer of FIG. 1.

As shown in FIG. 2, every integrated circuit 2 includes a number of terminals or pads 5, which are provided to allow electrical connection of the integrated circuit 2 to the associated connection pins during assembly in the supporting package once the circuit has been cut from the wafer. As shown in FIG. 3, a first pad 6 is provided to receive the supply voltage Vcc of the control circuit portion 3, a second pad 7 is provided to receive the supply voltage Vd of the power circuit portion 4, and a third pad 8 is designed for connection with another voltage reference, e.g., a signal ground GND. The pads 6, 7 and 8 are powered with different voltages only when the circuit is placed in operating condition. As shown in FIG. 2, in the greater part of cases the pads 6 and 7 are located near one side of the integrated circuit 2 opposite that side near which the pad 8 is located.

FIG. 2 shows additional pads 9 and 10, provided to allow diagnostic operations in accordance with the present invention and as described below. The pad 10 can coincide with a "tristate" terminal present in many integrated circuits and is generally positioned on a side of the integrated circuit 2 different from those on which are positioned pads 6, 7, and 8. Pad 10 is generally positioned on a side of the integrated circuit 2 opposite of the side with pad 9.

FIG. 2 shows that, in accordance with the present invention, inside and along the scribing lines 11 are provided connecting conducting line buses 12. Connecting conducting line buses 12 are connected between pads 6, 7, and 8 and their respective voltage sources Vcc, Vcc or Vd as appropriate, and GND. Connecting conductivity buses 12 also connect pads 9 and 10 to their respective signal sources. As shown in FIG. 1, connecting pads 18, 20, 22 and 23 on wafer 1 are connected to the connecting conducting line buses 12. During testing, a test station may be connected via probes to the wafer at pads 18, 20, 22 and 23. The pads 18, 20, 22, and 23 are connected to the appropriate wires within the bus 12 to connect the wafer to Vcc, Vd, GND, and diagnostic operation signals, respectively. If the bus 12 includes more than 4 metallized strips 13, additional pads 18, 20, 22, and 23 may be used. Of course, the pads 18, 20, 22, 23 can be positioned adjacent each other on one side of the wafer rather than at each edge.

Figure 4A:
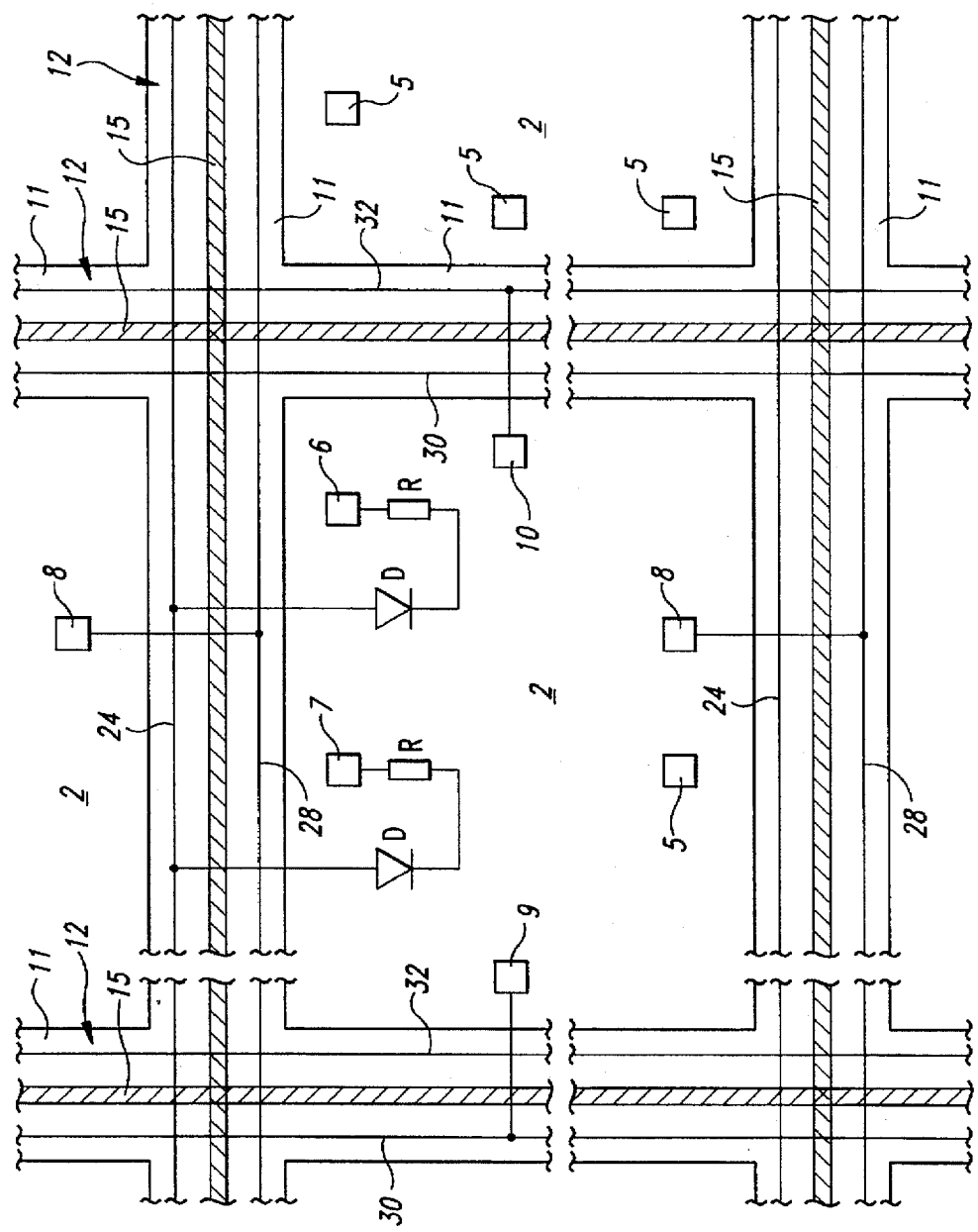
FIG. 4A shows schematically in even larger scale a detail of the group of integrated electronic circuits of FIG. 3A.
Figure 4B:
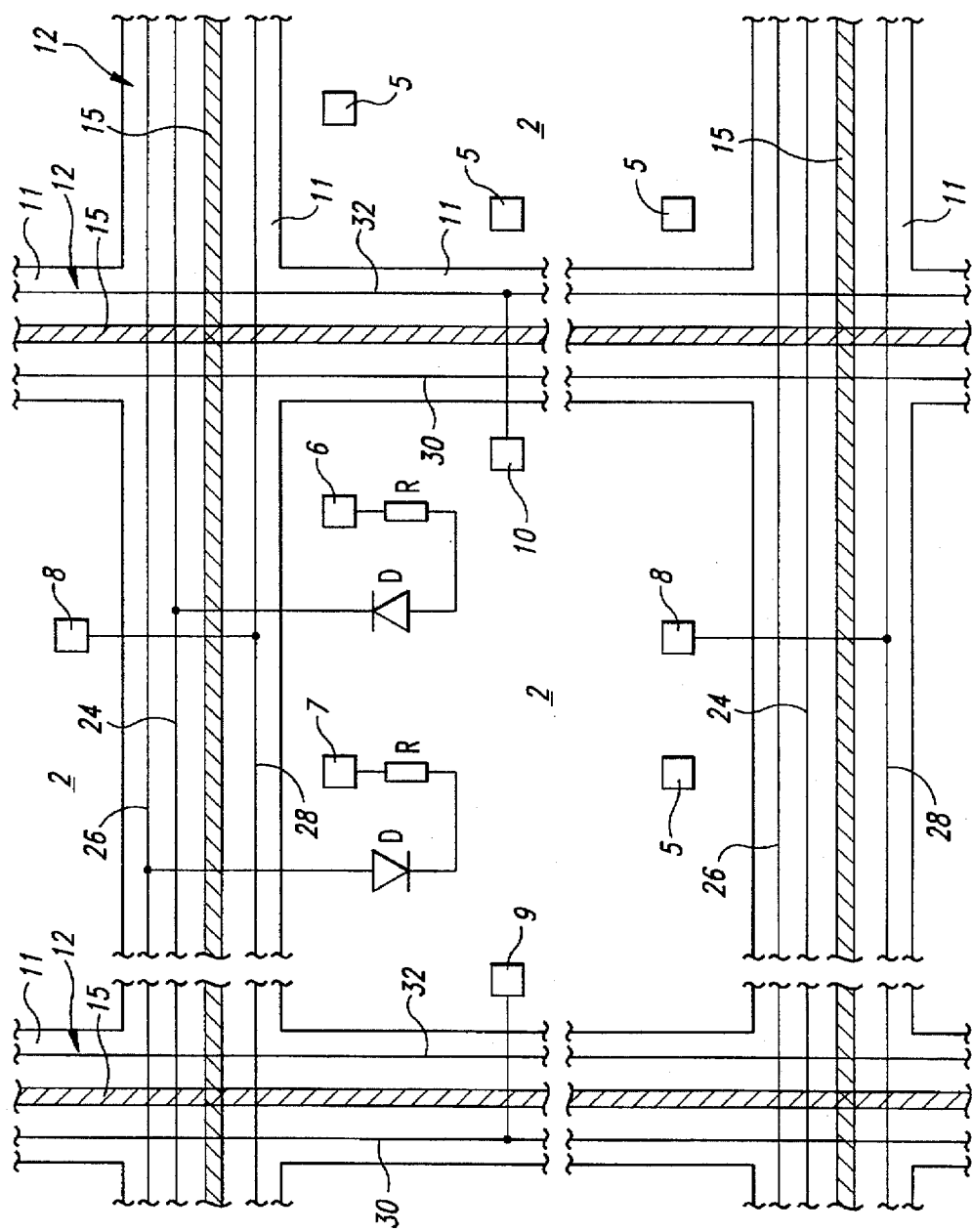
FIG. 4B shows schematically in even larger scale a detail of the group of integrated electronic circuits of FIG. 3B.

FIG. 4A shows that connecting conducting line buses 12 can include connecting conducting lines 24 and 28. In this embodiment, connecting conducting line 24 connects pads 6 and 7 with supply voltage Vcc, and connecting conducting line 28 connects pad 8 with signal ground GND. Connecting conducting lines 30 and 32 can also be provided to connect pins 9 and 10 with their respective signal sources. FIG. 4B shows that in another embodiment, the connecting conducting line bus 12 can further include connecting conducting line 26, which connects pad 7 with Vd.

As shown in FIG. 5, the connecting conducting line buses 12 can be individual metallization strips 13. The metallization strips 13 are covered by a protective insulation layer 14, e.g., a layer of nitride or silicon oxide deposited by a P-Vapox process. Also, at intersections between the connecting conducting line buses 12 there are appropriate insulation layers above and below each metallization strip where they cross to ensure that the lines do not short out. The protective insulation layer 14 also insulates the metallization strips 13 from the surface of the semiconductor substrate 16.

At the end of the process leading to production and testing of the integrated circuits 2, the wafer is cut along the scribing line 11 by means of a very thin diamond blade which cuts along a cutting path nearly central and indicated by reference number 15 in FIGS. 4A and 4B. In this manner the individual integrated circuits 2 are separated to be subjected to subsequent assembly operations in conventional packages (not shown). As shown in FIGS. 4A and 4B, the connecting conductor line bus 12 extends inside the scribing lines 11 parallel to a horizontal axis but in a slightly off-center position in relation to the axis. The horizontal axis represents the cutting path 15 of the diamond blade used for separation of the integrated circuits 2. A vertical axis represents another cutting path 15 of the diamond blade.

FIGS. 4A and 4B also show that the first pad 6 of the supply voltage Vcc is electrically connected to connecting conducting line 24 by means of a current limitation element 17. The current limitation element 17 preferably includes a resistance R and a protection diode D serially connected to the resistance. Both the protection diode D and the resistance R are provided by means of diffusion or an equivalent technique, such as forming polysilicon resistors, inside each integrated circuit 2. Nothing prevents using as current limitation element 17 only the resistance R, of approximately 10 kohm, or a current generator of adequate value.

Normally the anode of the protection diode D is connected to the connecting conducting line bus 12 as shown in FIGS. 2, 3A, and 4A. However, in CMOS circuits for which there is a higher supply voltage Vd provided and the semiconductor substrate is held at the lower supply voltage Vcc, the previous connection must be reversed. In this case, the anode of protection diode D is connected to Vcc or ground through the integrated circuit 2. This configuration is shown in FIG. 3B and FIG. 4B.

As shown in FIG. 4B, the second pad 7 of the supply voltage Vd is also electrically connected to the connecting conducting line bus 12 by means of the series of a resistance R and a protection diode D. The value of the resistance R can be approximately 10 kohm. All the pads 6 and 7 of the integrated circuits 2 incorporated in the wafer 1 are connected in the above stated manner to the connecting conducting line bus 12 located near them, i.e., to the connecting conducting line bus 12 of the scribing line 11 adjacent to them.

Even the ground connection pads 8 are connected to a corresponding connecting conducting line bus 12, but this connection is the direct type and requires no protection diode. Normally the connecting conducting line 12 to which the pad 8 is connected is located in a parallel scribing line 11 on a side of integrated circuit 2 opposite the side where pads 6 and 7 are located.

The particular configuration of the wafer 1 which the semiconductor material assumes allows application of a diagnostic procedure described below. The purpose of this diagnostic procedure is to identify defective integrated circuits 2.

For this diagnostic procedure, the connecting conducting line buses 12 are powered in such a manner as to activate in parallel all the integrated circuits 2. A voltage of Vcc may be supplied to the integrated circuits 2; however, a voltage lower than Vcc may also be used. The circuit may be tested even if pad 6 is at a voltage lower than operating voltage for integrated circuit 2 due to a voltage drop across resistor R. Here, the purpose is determining whether a short circuit is present, not testing correct function of the integrated circuit 2. While the current required by each integrated circuit 2 is on the order of a few milliamps, the current supplied to the wafer 1 can be on the order of 1–2 amps. In this manner, the temperature is increased because, due to the Joule effect, the wafer containing hundreds of circuits dissipates electrical power in the form of heat. This operational step should be performed in an inert atmosphere, e.g., containing nitrogen. Further, the wafer should be heated above a standard temperature during testing. A high temperature should be provided by a burn-in oven, but the use of a burn-in oven to provide the elevated temperature is not strictly necessary. However, the use of the Joule-effect heating described above may force only a few integrated circuits 2 to fail during the test, and some other integrated circuits 2 could have operating problems in the future that were undetected during the test. Therefore, the manufacturer may decide at which temperature to perform the burn-in test.

In addition, by making use of the tristate pad 10 it is possible by means of a test point to extinguish the circuit in such a manner that only the defective circuits absorb electrical power, i.e., those in which there is an internal short circuit. If an integrated circuit is defective or exhibits a failure condition, there is probably a short circuit in it which could connect the connecting conducting line bus 12 connected to the power supply pad 6 with the other connecting conducting line bus 12 connected to the ground pad 8. Depending on the type of failure, current in an integrated circuit 2 with a short circuit could be well in excess of several milliamps, and could be on the order of several amps. However, in accordance with the present invention, this potential danger is avoided by the presence of the resistance R on the connection between the pads 6 and 7 and the connecting conducting line bus 12. The resistance R limits the current passing through the short circuited integrated circuits 2. It has been calculated that current absorption of a defective chip can be about 1 mA if a short circuit occurs in an integrated circuit 2 connected to Vd, with a value of 12 volts, through resistance R with a value of 10 kohm. A short circuit current can be even lower, on the magnitude of 500 µA, if an integrated circuit 2 is connected to Vcc only, and not to Vd. The probability that a failure state might affect the resistance R is much lower than that of a failure of the integrated circuit 2 with which the resistance is associated. Furthermore, the protection diode D in series with the resistance protects the circuit during operation calling for grounding.

This protection diode D continues to provide protection even when the integrated circuit 2 has been sectioned from the wafer 1. FIG. 5 shows the metallization strip 13 sectioned vertically following cutting along the scribing line 11. The accessible edge of this metallization strip 13 could constitute an electrical connection path to the substrate. The presence of the protection diode D in the integrated circuit 2 also affords protection against this possible leakage to ground.

The present invention also allows drastic reduction of the "infant mortality" phenomenon of circuits already assembled because it is possible to determine failure states subsequent to the so-called zero time. This purpose is attained by stressing the gate oxide of CMOS or DMOS devices incorporated in the integrated circuits 2 with high temperature provided by a burn-in oven. The quality of the DMOS is critical in the thin gate oxide. The CMOS devices can be considered natural tristates since they do not absorb power when they are in an interdiction state. Nevertheless, they exhibit absorption peaks when they go into conduction.

In this context the pads 9 and 10 lend themselves effectively to this purpose because it is possible to apply a relatively slow synchronization pulse (clock) on the pad 9 and an enablement signal upon starting on the pad 10. In this manner it is possible to cyclically switch the integrated circuit 2 from the starting state to that of extinguishment for a predetermined period of time, seeking to force a failure state which would have occurred only after a first employment of the circuit. Therefore, the manufacturing method in accordance with the present invention makes possible a burn-in of the wafer by stressing to a failure state all those circuits which would not have had a particularly long useful life.

While various embodiments have been described in this application for illustrative purposes, the claims are not so limited. Rather, any equivalent method or device operating according to principles of the invention falls within the scope thereof.

We claim:

1. A wafer of semiconductor material comprising:
   a plurality of integrated circuits each having first and second pads;
   a plurality of scribing lines positioned such that said integrated circuits are regularly spaced;
   a plurality of electrical connection lines disposed within the scribing lines, one of said plurality of electrical connection lines for receiving a first voltage and another one of said plurality of electrical connection lines for receiving a second voltage; and
   a plurality of current limitation elements each connected between the first pad of a respective integrated circuit and said one of said plurality of electrical connection lines, each second pad of the integrated circuits being connected to said another one of said plurality of electrical connection lines such that all of said plurality of integrated circuits are simultaneously tested for electrical short prior to cutting and packaging of the integrated circuits into individual chips.

2. The wafer of claim 1 wherein said at least one electrical connection line comprises a metallization strip.

3. The wafer of claim 1 wherein said current limitation element comprises a first resistance element.

4. The wafer of claim 3 wherein said current limitation element further comprises a first one-way current protection element coupled in series with said first resistance element.

5. The wafer of claim 4 wherein said first one-way current protection element comprises a diode having an anode coupled to said one of said plurality of electrical connection lines.

6. The wafer of claim 4 wherein said plurality of electrical connection lines comprises at least a third electrical connection line coupled to a third pad of said integrated circuit via a second current limitation element, said third electrical connection line being electrically connectable to a third voltage source.

7. The wafer of claim 6 wherein the third voltage is higher than the first voltage.

8. The wafer of claim 6 wherein said second current limitation element comprises:
   a second resistance element; and
   a second one-way current protection element coupled in series with said second resistance element.

9. The wafer of claim 8 wherein said first one-way current protection element comprises a diode having a cathode coupled to said one of said electrical connection lines; and
   said second one-way current protection element comprises a diode having an anode coupled to said third electrical connection line.

10. The wafer of claim 1 wherein the second voltage is lower than the first voltage.

11. Method of monolithically fabricating and testing integrated circuits on a semiconductor support, the method comprising the steps of:
   forming a plurality of integrated circuits with a plurality of scribing lines, the scribing lines being located such that the integrated circuits are regularly spaced apart by the scribing lines;
   forming at least one electrical connection line in at least one of the scribing lines, the electrical connection line being a metallization strip provided in the scribing line;
   forming a plurality of current limitation elements each connected between the electrical connection line and a respective one of the integrated circuits; and
   simultaneously testing the plurality of integrated circuits for electrical short through the at least one electrical connection line prior to cutting and packaging of the integrated circuits into individual chips.

12. Method in accordance with claim 11 wherein the current limitation element is a resistance.

13. Method in accordance with claim 12 wherein the resistance is provided by diffusion or an equivalent technique in the integrated circuits.

14. Method in accordance with claim 11 wherein the current limitation element is a current generator.

15. Method in accordance with claim 11 wherein said step of forming a plurality of current limitation elements includes the step of forming at least one one-way protection element for each integrated circuit between the at least one electrical connection line and the integrated circuit.

16. Method in accordance with claim 15 wherein the one-way protection element is at least one protection diode.

17. Method in accordance with claim 15 wherein the protection diode is provided by diffusion or an equivalent technique in the integrated circuit.

18. Method in accordance with claim 11 wherein said step of forming a plurality of current limitation elements includes the step of forming the series of a protection diode and at least one resistance between the at least one electrical connection line and the integrated circuit.

19. Method in accordance with claim 11, further comprising the step of forming a protective insulation layer covering the metallization strip.

20. Wafer of semiconductor material comprising:
   a plurality of integrated circuits integrated monolithically on the wafer, and to be later cut and packaged into individual chips;
   a plurality of scribing lines, the integrated circuits being regularly spaced by said scribing lines;
   at least one electrical connection line in at least one of said scribing lines connected to at least one integrated circuit adjacent to the scribing line, said electrical connection line being a metallization strip provided in said scribing line, said electrical connection line operable to receive a voltage signal for testing said integrated circuits for an electrical short prior to cutting;
   a protective insulation layer covering said metallization strip; and
   at least one current limitation element including a one-way protection element and being coupled between said at least one electrical connection line and a pad of said at least one integrated circuit, said current limitation element limiting current through the integrated circuit when the electrical short through the respective integrated circuit occurs during testing prior to cutting.

21. Wafer in accordance with claim 20 wherein said current limitation element is connected to a pad of said integrated circuit, said current limitation element having one of a resistance element and a current generator.

22. Wafer in accordance with claim 21 wherein said resistance is at least 10 kohm.

23. Wafer in accordance with claim 20 wherein said current limitation element is connected to a pad of the integrated circuit, said current limitation element being a series of a protection diode and a resistance element.

24. Wafer in accordance with claim 20 wherein said one-way protection element is a diode.

25. Wafer in accordance with claim 24 wherein said one-way protection element has an anode coupled to the electrical connection line.

26. Circuit integrated monolithically on a wafer of semiconductor material together with other circuits regularly spaced apart by dividing scribing lines, said integrated circuit and other circuits to be later cut and packaged into individual chips, the integrated circuit comprising:
   a plurality of peripheral pads;
   an electrical connection line provided along a dividing scribing line adjacent to one of said pads, said electrical connection line operable to receive a voltage signal for testing said integrated circuit for electrical short prior to cutting; and
   a protection circuit connected between said at least one of said pads and said electrical connection line at, said protection circuit limiting current through said at least one of said pads when the electrical short occurs during testing of said integrated circuit.

27. Integrated circuit in accordance with claim 26 wherein said protection circuit comprises at least one resistance.

28. Integrated circuit in accordance with claim 26 wherein said protection circuit comprises a series of one diode and at least one resistance.

29. A semiconductor wafer containing a plurality of integrated circuits separated from each other by scribing line regions, each integrating circuit having first and second pads wherein the integrated circuits are to be later cut and packaged into individual chips, the semiconductor wafer comprising:
   first and second electrical lines disposed within the scribing line regions; and
   a plurality of current limitation elements each connected between the first pad of a respective integrated circuit and the first electrical line, each second pad of the plurality of integrated circuits being connected to the second electrical line such that all of the plurality of integrated circuits are simultaneously tested for electrical short prior to cutting.

30. A semiconductor wafer containing a plurality of integrated circuits to be later cut and packaged into individual chips, the semiconductor wafer comprising:
   a plurality of integrated circuits each having a first pad for receiving a supply voltage and a second pad for receiving a ground voltage during testing prior to cutting;
   a plurality of scribing line regions positioned to separate the plurality of integrated circuits from each other;
   first and second electrical lines disposed within the scribing line regions;
   a plurality of resistors each connected between the first pad of a respective integrated circuit and the first electrical line, each second pad of the plurality of integrated circuits being connected to the second electrical line such that all of the plurality of integrated circuits are simultaneously tested for electrical short prior to cutting, each resistor limiting current through the respective integrated circuit when an electrical short between the first and second pads of the respective integrated circuit occurs during testing prior to cutting.

* * * * *